US009866414B2

(12) United States Patent
Kim et al.

(10) Patent No.: US 9,866,414 B2
(45) Date of Patent: Jan. 9, 2018

(54) MODULATION AGNOSTIC DIGITAL HYBRID MODE POWER AMPLIFIER SYSTEM AND METHOD

(71) Applicant: DALI SYSTEMS CO. LTD., George Town, Grand Cayman (KY)

(72) Inventors: Wan Jong Kim, Coquitlam (CA); Kyoung Joon Cho, Coquitlam (CA); Shawn Patrick Stapleton, Burnaby (CA); Ying Xiao, Coquitlam (CA)

(73) Assignee: Dali Systems Co. Ltd., George Town (KY)

( * ) Notice: Subject to any disclaimer, the term of this patent is extended or adjusted under 35 U.S.C. 154(b) by 0 days.

(21) Appl. No.: 14/337,004

(22) Filed: Jul. 21, 2014

(65) Prior Publication Data
US 2015/0010110 A1 Jan. 8, 2015

Related U.S. Application Data

(63) Continuation of application No. 12/928,931, filed on Dec. 21, 2010, now Pat. No. 8,804,870.
(Continued)

(51) Int. Cl.
*H04L 27/36* (2006.01)
*H04L 27/00* (2006.01)
(Continued)

(52) U.S. Cl.
CPC ......... *H04L 27/0008* (2013.01); *H03F 1/304* (2013.01); *H03F 1/3241* (2013.01);
(Continued)

(58) Field of Classification Search
CPC ..... H04L 27/368; H03F 1/3247; H03F 1/3241
(Continued)

(56) References Cited

U.S. PATENT DOCUMENTS

| 3,651,316 A | 3/1972 | Gibson |
| 4,638,248 A | 1/1987 | Schweickert |

(Continued)

FOREIGN PATENT DOCUMENTS

| CA | 2 616 323 A1 | 12/2007 |
| CN | 102948071 A | 2/2013 |

(Continued)

OTHER PUBLICATIONS

International Search Report and Written Opinion of the International Searching Authority for Corresponding International Application No. PCT/IB2010/003449 dated Jun. 9, 2011, 5 pages.
(Continued)

*Primary Examiner* — Kevin M Burd
(74) *Attorney, Agent, or Firm* — Kilpatrick Townsend & Stockton LLP

(57) ABSTRACT

A RF-digital hybrid mode power amplifier system for achieving high efficiency and high linearity in wideband communication systems is disclosed. The present invention is based on the method of adaptive digital predistortion to linearize a power amplifier in the RF domain. The present disclosure enables a power amplifier system to be field reconfigurable and support multi-modulation schemes (modulation agnostic), multi-carriers and multi-channels. As a result, the digital hybrid mode power amplifier system is particularly suitable for wireless transmission systems, such as base-stations, repeaters, and indoor signal coverage systems, where baseband I-Q signal information is not readily available.

10 Claims, 9 Drawing Sheets

Related U.S. Application Data

(60) Provisional application No. 61/288,844, filed on Dec. 21, 2009.

(51) Int. Cl.

| | | |
|---|---|---|
| *H03F 1/32* | (2006.01) | |
| *H03F 1/30* | (2006.01) | |
| *H03F 3/08* | (2006.01) | |
| *H03F 3/19* | (2006.01) | |
| *H03F 3/24* | (2006.01) | |
| *H04W 24/02* | (2009.01) | |
| *H04L 25/06* | (2006.01) | |
| *H04L 25/08* | (2006.01) | |

(52) U.S. Cl.
CPC ......... *H03F 1/3247* (2013.01); *H03F 1/3258* (2013.01); *H03F 3/087* (2013.01); *H03F 3/19* (2013.01); *H03F 3/24* (2013.01); *H04L 25/067* (2013.01); *H04L 25/08* (2013.01); *H04L 27/368* (2013.01); *H04W 24/02* (2013.01); *H03F 2200/18* (2013.01); *H03F 2200/204* (2013.01); *H03F 2200/207* (2013.01); *H03F 2200/447* (2013.01); *H03F 2200/451* (2013.01); *H03F 2201/3206* (2013.01); *H03F 2201/3209* (2013.01); *H03F 2201/3212* (2013.01); *H03F 2201/3215* (2013.01); *H03F 2201/3224* (2013.01); *H03F 2201/3227* (2013.01)

(58) Field of Classification Search
USPC .......................................... 375/295, 296, 297
See application file for complete search history.

(56) References Cited

U.S. PATENT DOCUMENTS

| | | | |
|---|---|---|---|
| 5,453,976 A | 9/1995 | Glanville et al. | |
| 5,678,198 A | 10/1997 | Lemson | |
| 5,757,229 A | 5/1998 | Mitzlaff | |
| 5,963,090 A * | 10/1999 | Fukuchi | 330/149 |
| 6,246,286 B1 | 6/2001 | Persson | |
| 6,301,579 B1 | 10/2001 | Becker | |
| 6,424,225 B1 | 7/2002 | Choi et al. | |
| 6,625,429 B1 | 9/2003 | Yamashita | |
| 6,741,663 B1 | 5/2004 | Tapio et al. | |
| 6,747,649 B1 | 6/2004 | Sanz-Pastor et al. | |
| 6,751,447 B1 | 6/2004 | Jin et al. | |
| 6,903,604 B2 | 6/2005 | Kim | |
| 7,102,442 B2 | 9/2006 | Anderson | |
| 7,109,998 B2 | 9/2006 | Smith | |
| 7,362,125 B2 | 4/2008 | Gupta et al. | |
| 7,372,918 B2 | 5/2008 | Muller et al. | |
| 7,535,298 B2 | 5/2009 | Sihlbom et al. | |
| 7,542,518 B2 | 6/2009 | Kim et al. | |
| 7,555,058 B2 | 6/2009 | Hori et al. | |
| 7,583,754 B2 | 9/2009 | Liu | |
| 7,593,450 B2 | 9/2009 | Conyers et al. | |
| 7,606,324 B2 | 10/2009 | Cai et al. | |
| 7,831,221 B2 | 11/2010 | Leffel et al. | |
| RE42,287 E | 4/2011 | Apodaca et al. | |
| 8,218,676 B2 | 7/2012 | Borkar et al. | |
| 8,804,870 B2 | 8/2014 | Kim et al. | |
| 2003/0179829 A1 | 9/2003 | Pinckley et al. | |
| 2004/0189378 A1 * | 9/2004 | Suzuki et al. | 330/52 |
| 2005/0079834 A1 | 4/2005 | Maniwa et al. | |
| 2005/0101254 A1 * | 5/2005 | Sasaki et al. | 455/63.1 |
| 2005/0262498 A1 | 11/2005 | Ferguson et al. | |
| 2006/0012426 A1 | 1/2006 | Nezami | |
| 2006/0088125 A1 | 4/2006 | Miyatane et al. | |
| 2006/0133536 A1 | 6/2006 | Rexberg | |
| 2006/0270366 A1 | 11/2006 | Rozenblit et al. | |
| 2007/0075780 A1 | 4/2007 | Krvavac et al. | |
| 2007/0171234 A1 | 7/2007 | Crawfis et al. | |
| 2008/0095264 A1 * | 4/2008 | Deng et al. | 375/296 |
| 2008/0130788 A1 | 6/2008 | Copeland | |
| 2008/0139141 A1 | 6/2008 | Varghese et al. | |
| 2008/0224750 A1 * | 9/2008 | Reddy | H03H 17/0027 327/276 |
| 2008/0265996 A1 * | 10/2008 | Kim et al. | 330/291 |
| 2009/0146736 A1 | 6/2009 | Kim et al. | |
| 2009/0163156 A1 | 6/2009 | Rofougaran et al. | |
| 2009/0184763 A1 | 7/2009 | Kim | |
| 2009/0232191 A1 | 9/2009 | Gupta et al. | |
| 2012/0133433 A1 * | 5/2012 | Li et al. | 330/149 |

FOREIGN PATENT DOCUMENTS

| | | |
|---|---|---|
| EP | 1746720 A1 | 1/2007 |
| EP | 2 131 491 A1 | 9/2009 |
| EP | 2517353 | 10/2012 |
| IN | 6164/CHENP/2012 A | 11/2013 |
| JP | 2004-165900 A | 6/2004 |
| JP | 2006-279780 A | 10/2006 |
| WO | WO 2001/008297 A1 | 2/2001 |
| WO | 2004-112240 A1 | 12/2004 |
| WO | 2005/053153 A1 | 6/2005 |
| WO | WO 2008/154077 A1 | 12/2008 |
| WO | WO 2011/077247 A2 | 6/2011 |

OTHER PUBLICATIONS

English Translation and Notice of Reasons for Rejection for corresponding Japanese Patent Application No. P2012-545469 dated Oct. 7, 2014, 6 pages.

Extended European Search Report for corresponding European Patent Application No. 1083877838 dated Oct. 20, 2014, 7 pages.

English Translation and Notification for the First Office Action for corresponding Chinese Patent Application No. 201080064414.0 dated Oct. 20, 2014, 14 pages.

Non-Final Office Action for U.S. Appl. No. 12/928,931 dated Aug. 21, 2013, 7 pages.

Final Office Action for U.S. Appl. No. 12/928,931 dated Feb. 20, 2014, 9 pages.

Notice of Allowance for U.S. Appl. No. 12/928,931 dated Apr. 14, 2014, 7 pages.

Partial European Search Report for European Application No. 16166094.9, dated Aug. 10, 2016, 9 pages.

Extened European Search Report for European Application No. 16166094.9, dated Jan. 26, 2017, 18 pages.

Harteneck et al, "Algorithmic Engineering Applied to the QR-RLS Adaptive Algorithm", Proceedings of 4th International Conference on Mathematics in Signal Processing, Dec. 31, 1996, XPO55336569, 11 pages.

Ningjing, Zheng et al, "Digital Predistortion Based on QRD-RLS Algorithm and Its Implementation Using FPGA", 2009 First International Conferance on Information Science and Engineering (ICISE 2009) Dec. 26-28, 2009, Nanjing, China, IEEE, Piscataway, NJ, Dec. 26, 2009, pp. 200-203, XP031663500, ISBN: 978-1-4244-4909-5.

* cited by examiner

FIG. 1. Basic Digital Hybrid Mode Power Amplifier System

FIG. 2. Digital Predistortion Block Diagram

FIG. 3. Polynomial based PD in an embodiment of Digital Hybrid Mode Predistortion PA System

PRIOR ART

FIG. 4. Digital Predistortion Algorithm

FIG. 5. Delay Estimation Block

Figure 6 Fractional Delay Block

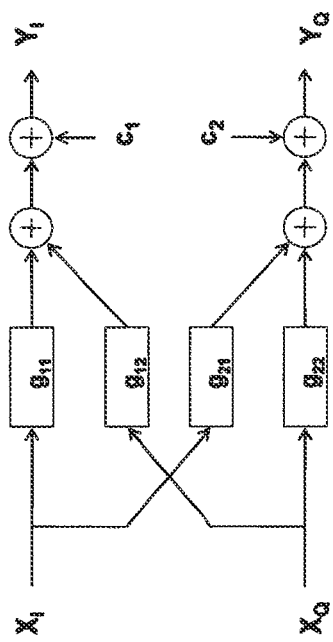
Figure 9 Analog Quadrature Modulator Compensation Block
PRIOR ART

MODULATION AGNOSTIC DIGITAL HYBRID MODE POWER AMPLIFIER SYSTEM AND METHOD

RELATED APPLICATIONS

This application is a continuation of U.S. patent application Ser. No. 12/928,931, filed Dec. 21, 2010; which claims priority to U.S. Provisional Patent Application No. 61/288,844, filed on Dec. 21, 2009. The disclosures of each are hereby incorporated by reference in their entirety for all purposes.

FIELD OF THE INVENTION

The present invention generally relates to wireless communication systems using complex modulation techniques. More specifically, the present invention relates to power amplifier systems for wireless communications.

BACKGROUND OF THE INVENTION

A wideband mobile communication system using complex modulation techniques, such as wideband code division multiple access (WCDMA) and orthogonal frequency division multiplexing (OFDM), has large peak-to-average power ratio (PAPR) specifications and hence requires highly linear power amplifiers for its RF transmissions. The conventional feedforward linear power amplifier (FFLPA) has been widely utilized due to its excellent linearity performance in spite of poor power efficiency.

Conventional FFLPAs are mainly based on the principle of error subtraction and power-matching with dedicated hardware circuitries to realize nonlinear corrections to PA. These approaches must use an auxiliary PA and complicated hardware circuitries to match exactly the transmitted power-balance, time-delay and errors generated by the main PA. After a perfect matching is obtained, the non-linear distortion errors from the main PA can then be canceled by those distortion errors from the auxiliary PA. Due to the complexities of the nonlinear predistortion circuits, which among other things involve many variables and parameters, FFLPAs require significant fine tuning and other calibration efforts. In addition, such traditional FFLPA schemes are also vulnerable to fluctuating environmental conditions, such as temperature and humidity changes, since perfect alignment of the main PA's signal and that of the auxiliary PA are vital. As a result, traditional predistortion schemes are costly to implement and are limited in their predistortion accuracy and stability in a commercial wireless system environment.

In order to overcome the FFLPA's poor efficiency, digital baseband predistortion (PD) has been demonstrated due to the recent advances in digital signal processing (DSP) technology. In addition, Doherty power amplifiers (DPA) have also been applied to these linearization systems to improve power efficiency. However, there is still a demand for higher performance of the power amplifier such as more linearity and better efficiency with less expensive architecture.

Conventional DSP-based PD schemes utilize digital microprocessors to compute, calculate and correct the PA's nonlinearities, typically by performing fast tracking and adjustments of signals in the PA system. However, conventional DSP-based PD schemes are challenged by variations of the linearity performance of the amplifier due to changes in the environment such as temperature and the asymmetric distortions of the output signal of the PA resulting from memory effects. All of these variations and distortions have to be compensated for. Conventional PD algorithms are based on a wideband feedback signal, and require a high speed analog-to-digital converter (ADC) in order to capture the necessary information. In addition, time-synchronizations are typically required to capture an error signal between a reference signal and a distorted signal. This time-matching process may result in small synchronization errors which can further affect conventional PD schemes' linearization performance. Amplitude and phase synchronization is also required in order to align the reference signal and the distorted signal.

Moreover, conventional PD schemes necessitate coded in-phase (I) and quadrature (Q) channel signals in the baseband as the required ideal or reference signals. As a result, conventional PD schemes are often standard or modulation specific and must be closely tailored to each baseband system. Therefore, in order to deploy conventional PD schemes into base-stations, the PD engines must be embedded into the baseband architecture of base-stations. This embedment is a practical implementation challenge since it is frequently inconvenient or impossible to modify the baseband architectures of existing base-stations or base-station designs. Once the PD scheme is set up for a specific base-station design, it is often not reconfigurable and hence not upgradeable to future changes in standards or modulations. Furthermore, since traditional PD approaches require baseband I-Q signal sources to operate, they are inapplicable to certain RF systems that do not possess any baseband I-Q signal sources, such as repeater and indoor signal coverage sub-systems.

BRIEF SUMMARY OF THE INVENTION

Accordingly, the present invention has been made in view of the above problems, and it is an object of the present invention to provide a high performance and cost effective method of power amplifier systems with high linearity and high efficiency for wideband communication system applications. The present disclosure provides a field-reconfigurable power amplifier system that supports multi-modulation schemes (modulation agnostic), multi-carriers and multi-channels. In multi-channel configurations of the present invention there can be more than one PA for multiple bands.

To achieve the above objects, the present invention is generally based on the method of adaptive digital predistortion to linearize a power amplifier in the RF domain. Various embodiments of the invention are disclosed. In an embodiment, the combination of crest factor reduction, PD, power efficiency boosting techniques as well as coefficient adaptive algorithms are utilized within a PA system. In another embodiment, analog quadrature modulator compensation structure is also utilized to enhance performance.

Some embodiments of the present invention are able to monitor the fluctuation of the power amplifier characteristics and to self-adjust by means of a self-adaptation algorithm. One such self-adaptation algorithm presently disclosed is called a digital predistortion algorithm, which is implemented in the digital domain.

Applications of the present invention are suitable for use with all wireless base-stations, access points, mobile equipment and wireless terminals, portable wireless devices, and other wireless communication systems such as microwave and satellite communications.

A RF-digital hybrid mode power amplifier system for achieving high efficiency and high linearity in wideband communication systems is disclosed. The present invention is based on the method of adaptive digital predistortion to linearize a power amplifier in the RF domain. The power amplifier characteristics such as variation of linearity and asymmetric distortion of the amplifier output signal are sampled in a feedback path and controlled by the adaptation algorithm in a digital module. Therefore, in an embodiment, the present invention is capable of compensating for the nonlinearities as well as memory effects of power amplifier systems and also improves performance, in terms of power added efficiency, adjacent channel leakage ratio (ACLR) and peak-to-average power ratio. The present disclosure enables a power amplifier system to be field reconfigurable and support multi-modulation schemes (modulation agnostic), multi-carriers and multi-channels. As a result, the digital hybrid mode power amplifier system is particularly suitable for wireless transmission systems, such as base-stations, repeaters, and indoor signal coverage systems, where baseband I-Q signal information is not readily available.

THE FIGURES

Further objects and advantages of the present invention can be more fully understood from the following detailed description taken in conjunction with the accompanying drawings in which:

FIG. 9 is a block diagram showing an embodiment of the analog quadrature modulator compensation structure.

GLOSSARY

The acronyms used herein have the following meanings:
ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
CDMA Code Division Multiple Access
CFR Crest Factor Reduction
DAC Digital to Analog Converter
DET Detector
DHMPA Digital Hybrid Mode Power Amplifier
DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
QAM Quadrature Amplitude Modulation
QPSK Quadrature Phase Shift Keying
RF Radio Frequency
SAW Surface Acoustic Wave Filter
UMTS Universal Mobile Telecommunications System
UPC Up Converter
WCDMA Wideband Code Division Multiple Access
WLAN Wireless Local Area Network

DETAILED DESCRIPTION OF THE INVENTION

The present invention is a novel RF-out PA system that utilizes an adaptive digital predistortion algorithm. The present invention is a hybrid system of digital and analog modules. The interplay of the digital and analog modules of the hybrid system both linearize the spectral regrowth and enhance the power efficiency of the PA while maintaining or increasing the wide bandwidth. The present invention, therefore, achieves higher efficiency and higher linearity for wideband complex modulation carriers.

Figure 1:
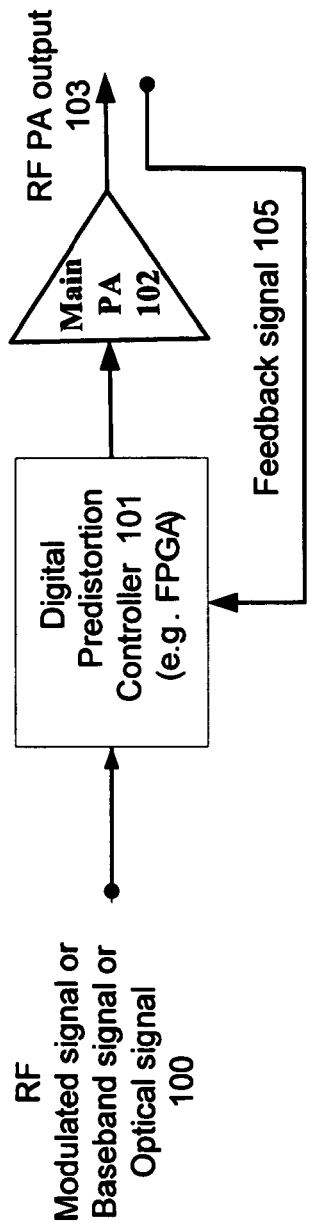
FIG. 1 is a block diagram showing the basic form of a digital hybrid mode power amplifier system.

FIG. 1 is a high level block diagram showing the basic system architecture which can be thought of, at least for some embodiments, as comprising digital and analog modules and a feedback path. The digital module is the digital predistortion controller 101 which comprises the PD algorithm, other auxiliary DSP algorithms, and related digital circuitries. The analog module is the main power amplifier 102, other auxiliary analog circuitries such as DPA, and related peripheral analog circuitries of the overall system. The present invention is a "black box", plug-and-play type system because it accepts RF modulated signal 100 as its input, and provides a substantially identical but amplified RF signal 103 as its output, therefore, it is RF-in/RF-out. Baseband input signals can be applied directly to the Digital Predistorter Controller according to one embodiment of the present invention. An Optical input signal can be applied directly to the Digital Predistorter Controller according to one embodiment of the present invention. The feedback path essentially provides a representation of the output signal to the predistortion controller 101. The present invention is sometimes referred to as a digital hybrid mode power-amplifier (DI-IMPA) system hereinafter.

Digital Predistorter Algorithm

Figure 2:
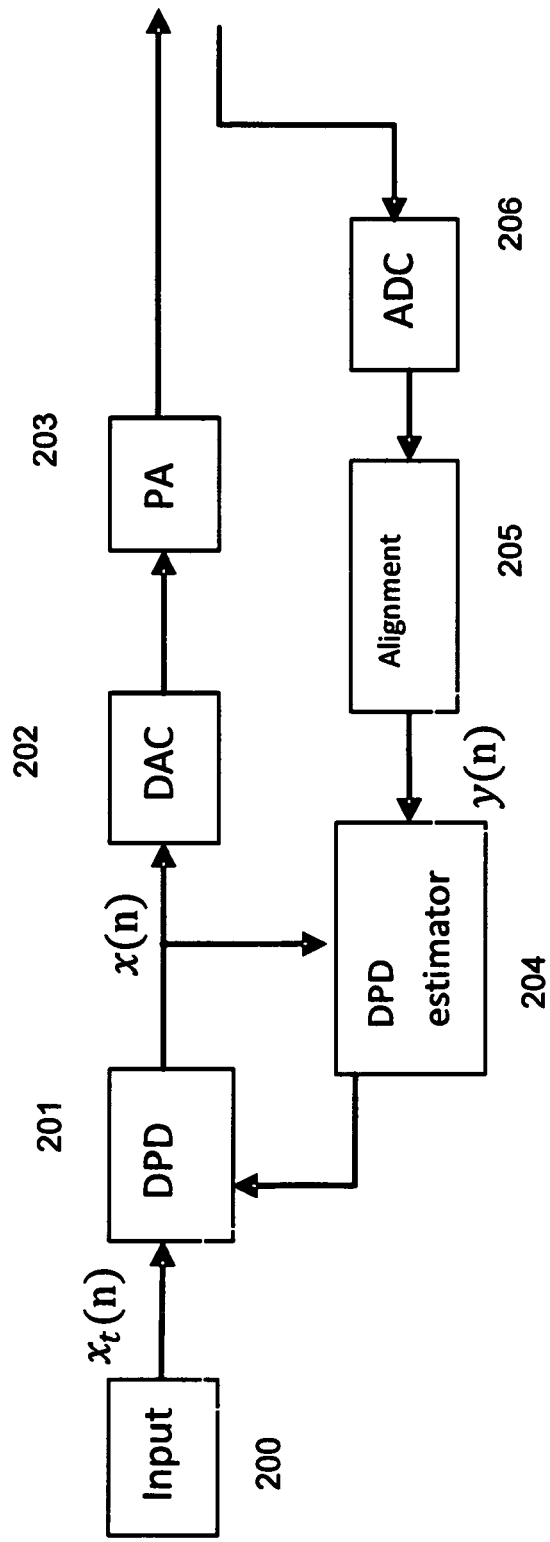
FIG. 2 is a block diagram showing a simple digital predistortion block diagram for a power amplifier system according to one embodiment of the present invention.

Digital Predistortion (DPD) is a technique to linearize a power amplifier (PA). FIG. 2 shows in block diagram form an embodiment of a linear digitally predistorted PA. In the DPD block, a memory polynomial model is used as the predistortion function (FIG. 3), and complies with the formula:

$$z(n) = \sum_{i=0}^{n-1} x_i(x-i)\left(\sum_{j=0}^{k-1} a_{ij}|x_i(n-1)|^j\right)$$

where $a_{ij}$ are the DPD coefficients.

Figure 4:
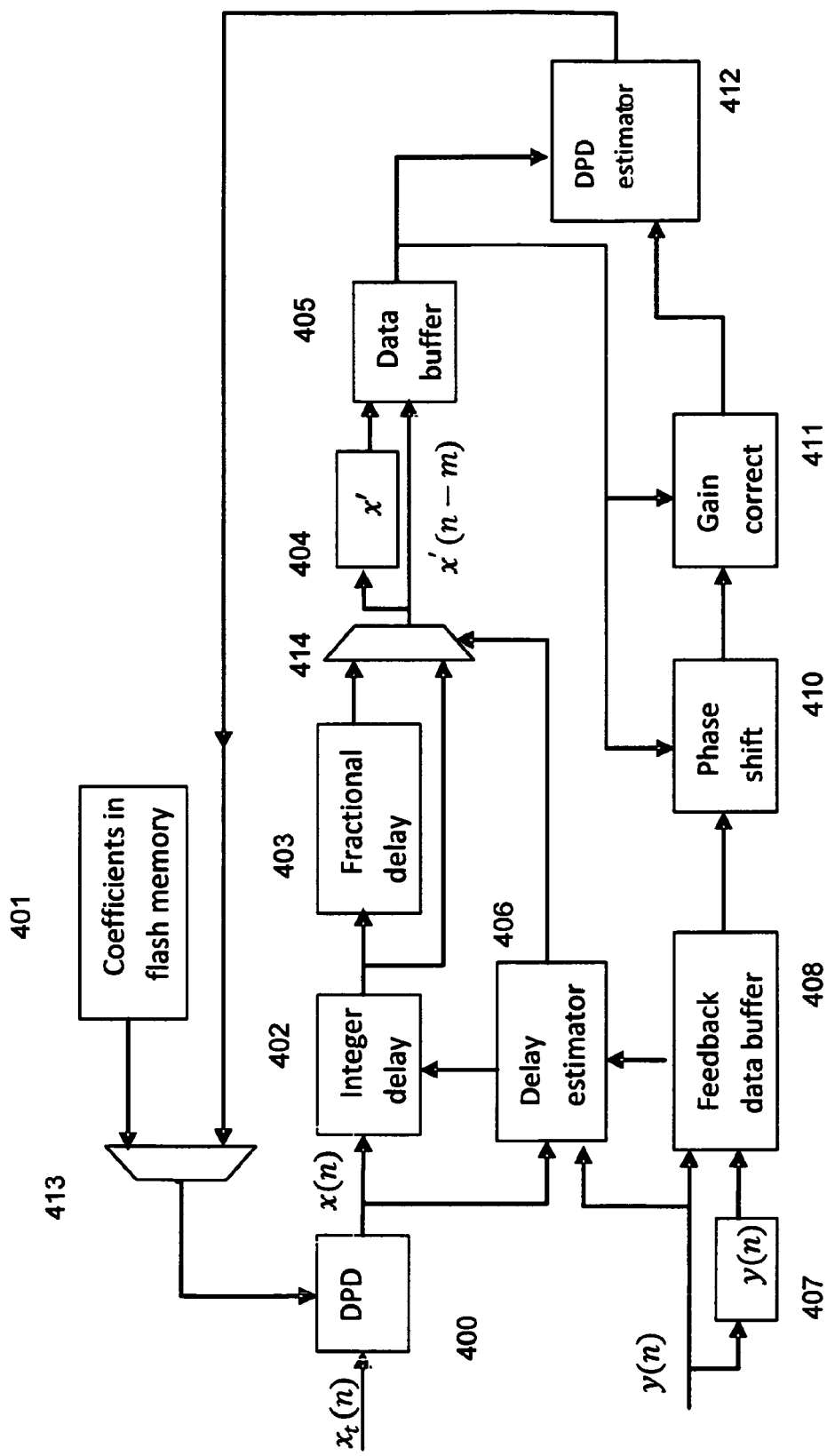
FIG. 4 is a block diagram of the digital predistortion algorithm applied for self-adaptation in a digital hybrid mode power amplifier system of the present invention.

In the DPD estimator block, a least square algorithm is utilized to find the DPD coefficients, and then transfer them to DPD block. The detailed DPD algorithm is shown in FIG. 4.

Figure 3:
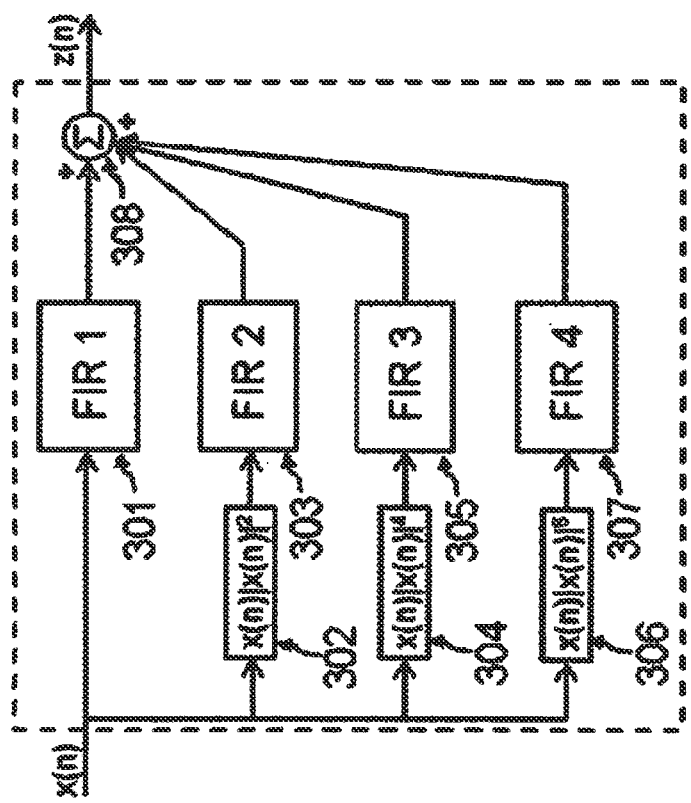
FIG. 3 is a block diagram showing polynomial-based predistortion in a digital hybrid mode power amplifier system of the present invention.

FIG. 3 is a block diagram showing a predistortion (PD) part in the DHMPA system of the present invention. The PD in the present invention generally utilizes an adaptive polynomial-based digital predistortion system. Another embodiment of the PD utilizes a LUT-based digital predistortion system. More specifically, the PD illustrated in FIG. 3 and in embodiments disclosed in FIG. 7 and FIG. 8, discussed below, are processed in the digital processor by an adaptive algorithm, presented in U.S. patent application Ser. No. 11/961,969, entitled A Method for Baseband Predistortion Linearization in Multi-Channel Wideband Communication Systems. The PD for the DHMPA system in FIG. 3 has multiple finite impulse response (FIR) filters, that is, FIR1 301, FIR2 303, FIR 305, and FIR4 307. The PD also contains the third order product generation block 302, the fifth order product generation block 304, and the seventh order product generation block 306. The output signals from FIR filters are combined in the summation block 308. Coefficients for multiple FIR filters are updated by the digital predistortion algorithm.

Delay Estimation Algorithm:

The DPD estimator compares x(n) and its corresponding feedback signal y(n−Δd) to find the DPD coefficients, where Δd is the delay of the feedback path. As the feedback path delay is different for each PA, this delay should be identified before the signal arrives at the coefficient estimation. In this design, the amplitude difference correlation function of the transmission, x(n), and feedback data, y(n), is applied to find the feedback path delay. The correlation is given by $$C(m) = \sum_{i=0}^{N-1} \text{sign}(x(i+1) - x(i))\text{sign}(y(i+m+1) - y(i+m))$$

$$n(\text{delay}) = \text{Max}(C(m))$$

Figure 5:
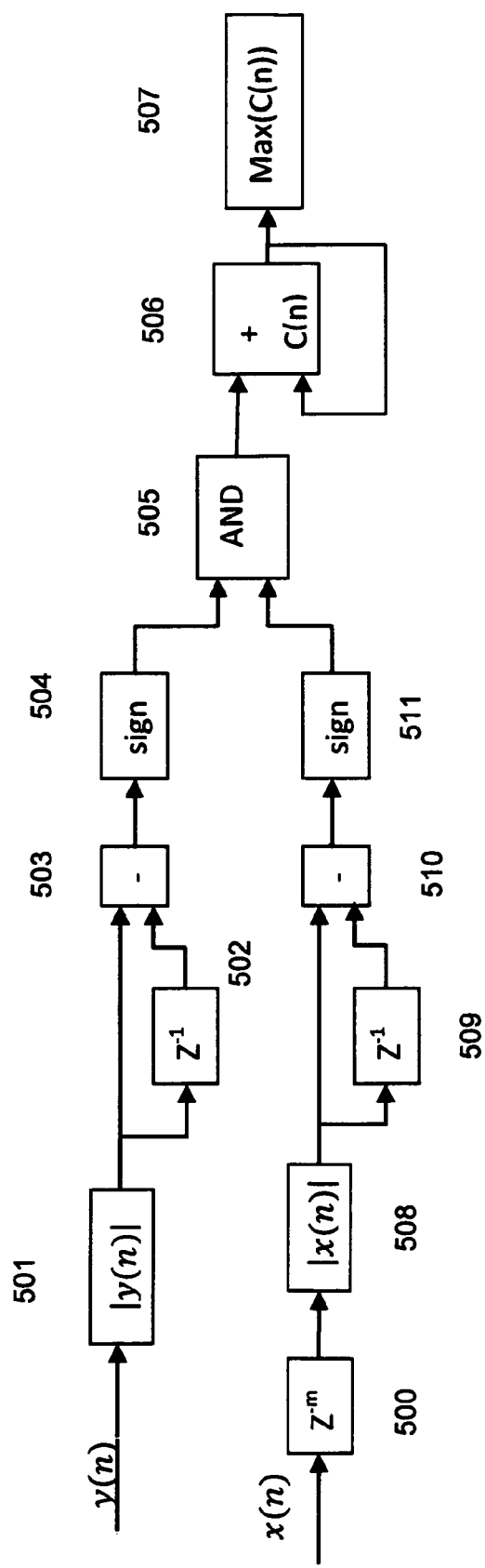
FIG. 5 is a delay estimation block diagram of the present invention.

The delay n that maximizes the correlation C(m) is the feedback path delay. The delay estimation block is shown in FIG. 5.

Figure 6:
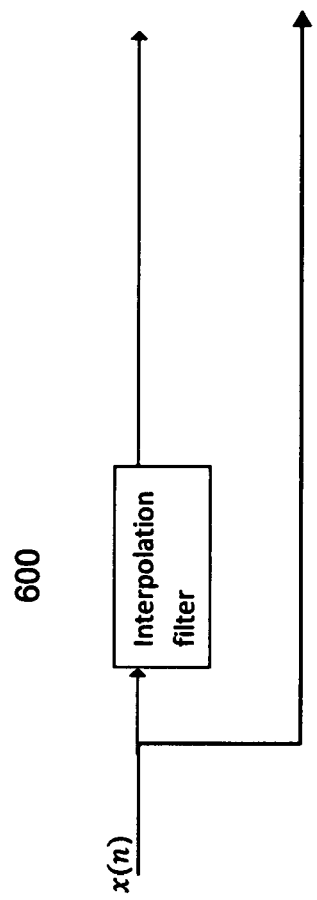
FIG. 6 is a block diagram of a fractional delay for the present invention.

Since the feedback path goes through analog circuitry, the delay between the transmission and feedback path could be a fractional sample delay. To synchronize the signals more accurately, fractional delay estimation is necessary. To simplify the design, only a half-sample delay is considered in this design, as shown in FIG. 6. It will be appreciated that smaller fractional delays can also be utilized in at least some embodiments.

To get the half-sample delay data, an upsampling approach is the common choice, but in this design, in order to avoid a very high sampling frequency in the FPGA, an interpolation method is used to get the half-sample delay data. The data with integer delay and fractional delay are transferred in parallel. The interpolation function for fractional delay is $$y(n) = \sum_{i=0}^{3} c_i x(n+i)$$

in which $c_i$ is the weight coefficient.

Whether the fractional delay path or the integer delay path will be chosen is decided by the result of the amplitude difference correlator. If the correlation result is odd, the integer path will be chosen, otherwise the fractional delay path will be chosen.

Phase offset Estimation and Correction Algorithm:

Phase offset between the transmission signal and the feedback signal exists in the circuit. For a better and faster convergence of the DPD coefficient estimation, this phase offset should be removed.

The transmission signal x(n) and feedback signal y(n) can be expressed as $$x(n)=|x(n)|e^{j\theta x} \text{ and } y(n)=|y(n)|e^{j\theta y},$$

The phase offset $e^{j(\theta x-\theta y)}$ can be calculated through $$e^{j(\theta_x-\theta_y)} = \frac{x(n)y(n)^*}{|x(n)||y(n)|}$$

So, the phase offset between the transmission and feedback paths is $$e^{j\theta_{o'}} = \text{mean}\left(\frac{x(n)y(n)^*}{|x(n)||y(n)|}\right)$$

The feedback signal with the phase offset removed can be calculated by $$\bar{y}(n) = y(n)e^{j\theta_o}$$

Magnitude Correction:

As the gain of the PA may change slightly, the feedback gain should be corrected to avoid the error from the gain mismatch. The feedback signal is corrected according to the function $$\bar{y}(n) = y(n)\frac{\sum_{i=1}^{N}|x(i)|}{\sum_{i=1}^{N}|y(i)|}$$

In this design, N is chosen to be 4096. The choice of N will depend on the desired accuracy.

QR_RLS Adaptive Algorithm:

The least square solution for DPD coefficient estimation is formulated as $$F(x(n)) = y(n)$$

$$F(x(n)) = \sum_{i=1}^{N} \sum_{j=0}^{K} a_{ij} x(n-i)|x(n-i)|^j$$

Define $h_k = x(n-i)|x(n-i)|^j$, where $k=(i-1)N+j$. The least square formulation can be expressed as:

$$\sum_{k=1}^{N \times K} w_k h_k = y(n)$$

In this design, QR-RLS algorithm (Haykin, 1996) is implemented to solve this problem. The formulas of QR_RLS algorithm are $$\begin{cases} d(i) \triangleq y(i) - h_i \overline{w} \\ \overline{w}_i \triangleq w_i - \overline{w} \\ q_i \triangleq \Phi_i^{*/2}[w_i - \overline{w}] \end{cases}$$

where $\Phi_i$ is a diagonal matrix, and $q_i$ is a vector.

The QR_RLS algorithm gets the ith moment $\Phi_i$ and $q_i$ from its (i-1)th moment through a unitary transformation:

$$A = \begin{bmatrix} \Phi_i^{1/2} & 0 \\ q_i^* & e_a^*(i)\gamma^{\frac{1}{2}}(i) \\ h_i\Phi_i^{*/2} & \gamma^{\frac{1}{2}}(i) \end{bmatrix} = \begin{bmatrix} \lambda^{1/2}\Phi_{i-1}^{1/2} & h_i^* \\ \lambda^{1/2}q_{i-1}^* & d(i)^* \\ 0 & 1 \end{bmatrix} \theta_i$$

$\theta_i$ is a unitary matrix for unitary transformation.

To apply QR_RLS algorithm more efficiently in FPGA, a squared-root-free Givens rotation is applied for the unitary transformation process (E.N. Frantzeskakis, 1994)

$$\begin{bmatrix} a_1 & a_2 & \dots & a_n \\ b_1 & b_2 & \dots & b_n \end{bmatrix} = \begin{bmatrix} \sqrt{k_a} & 0 \\ 0 & \sqrt{k_b} \end{bmatrix} \begin{bmatrix} a_1' & a_2' & \dots & a_n' \\ b_1' & b_2' & \dots & b_n' \end{bmatrix}$$

$$\begin{bmatrix} a_1' & a_2' & \dots & a_n' \\ b_1' & b_2' & \dots & b_n' \end{bmatrix} \theta = \begin{bmatrix} \sqrt{k_a'} & 0 \\ 0 & \sqrt{k_b'} \end{bmatrix} \begin{bmatrix} 1 & a_2'' & \dots & a_n'' \\ 0 & b_2'' & \dots & b_n'' \end{bmatrix}$$

$$k_a' = k_a a_1^2 + k_b b_1^2$$

$$k_b' = k_a k_b / k_a'$$

$$a_j' = (k_a a_1 a_j + k_b b_1 b_j)/k_a'$$

$$b_j' = -b_1 a_j + a_1 b_j$$

For RLS algorithm, the ith moment is achieved as below:

$$\begin{bmatrix} \lambda^{1/2}\Phi_{i-1}^{*/2} & h_i^* \\ \lambda^{1/2}q_{i-1}^* & d(i)^* \\ 0 & 1 \end{bmatrix} \theta_i = \begin{bmatrix} \overline{\Phi_i^{1/2}} & 0 \\ \overline{q_i^*} & e_a^*(i)\gamma^{\frac{1}{2}}(i) \\ \overline{h_i \Phi_i^{*/2}} & \gamma^{\frac{1}{2}}(i) \end{bmatrix} \begin{bmatrix} \sqrt{k_a} & 0 \\ 0 & \sqrt{k_b} \end{bmatrix}$$

$w_i$ can be obtained by solving $$\Phi^{*/2}[w_i - \overline{w}] = \overline{q}_i$$

In the iterative process, a block of data (in this design, there are 4096 data in one block) is stored in memory, and the algorithm uses all the data in memory to estimate the DPD coefficient. In order to make the DPD performance more stable, the DPD coefficients are only updated after one block of data is processed. The matrix A will be used for the next iteration process, which will make the convergence faster.

To make sure the performance of the DPD is stable, a weighting factor f is used when updating the DPD coefficients as $$w_i = f \times w_{i-1} + (1-f) w_i$$

The DPD coefficient estimator calculates coefficients $w_i$ by using QR_RLS algorithm. These $w_i$ are copied to the DPD block to linearize the PA.

Figure 7:
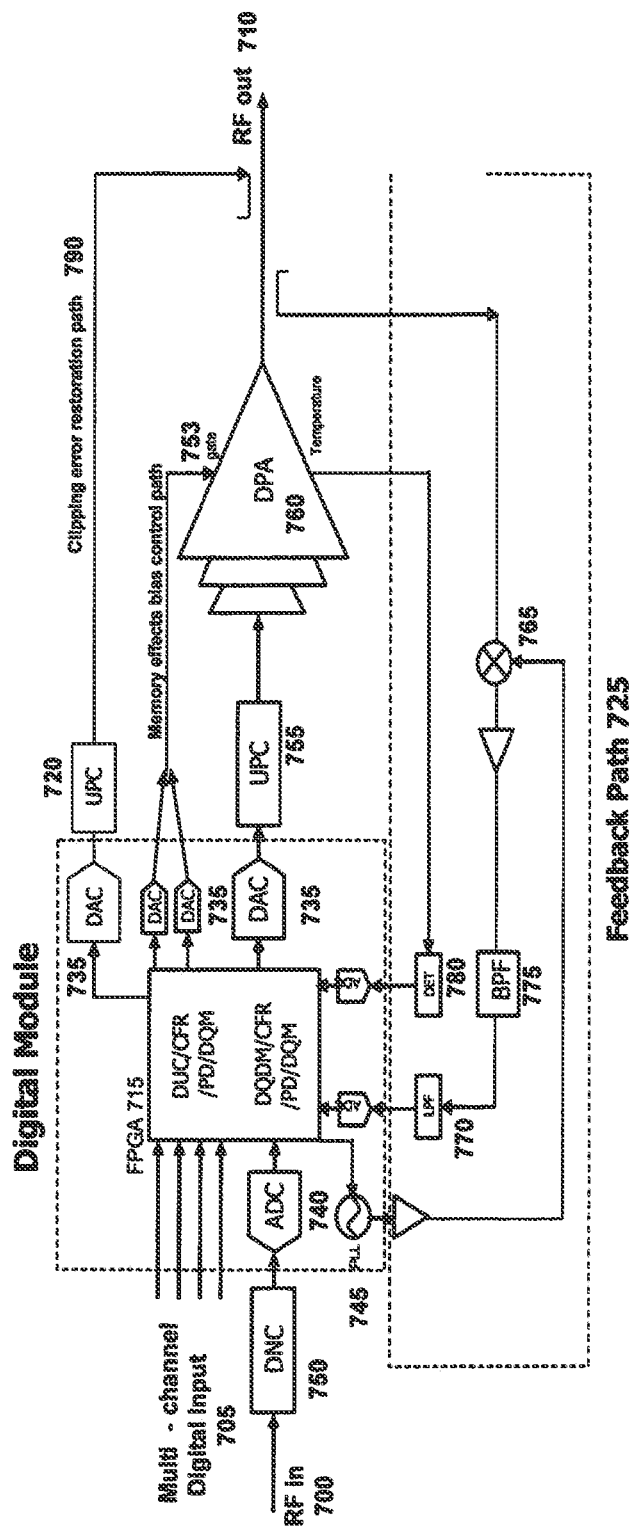
FIG. 7 is a block diagram showing a digital hybrid mode power amplifier system implemented with a down converter (DNC) and UPC-based clipping error restoration path according to another embodiment of the present invention.
Figure 8:
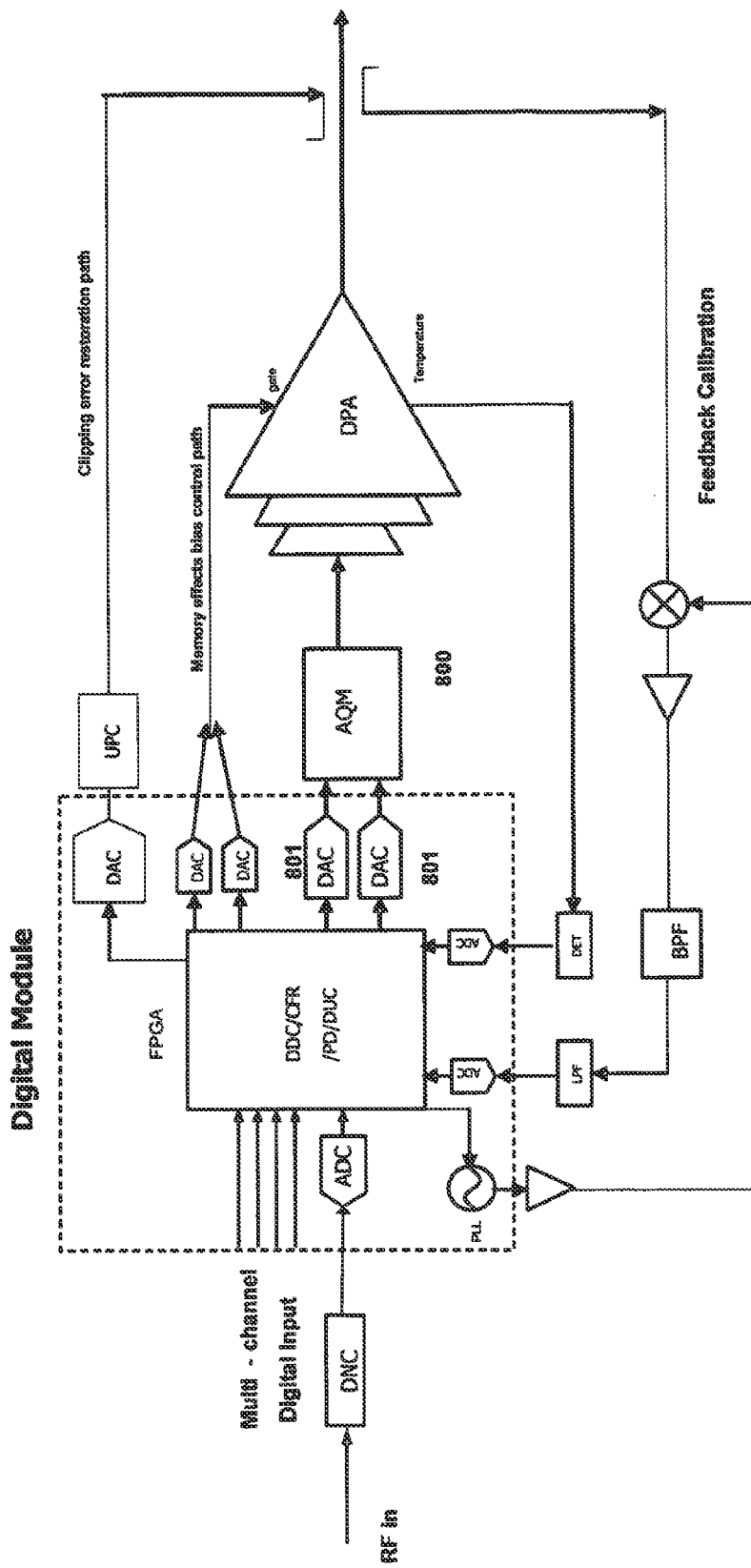
FIG. 8 is a block diagram showing a digital hybrid mode power amplifier system implemented with a DNC and an analog quadrature modulator (AQM) according to another embodiment of the present invention.

FIGS. 7 and 8 are block diagrams showing more sophisticated embodiments of DHMPA system, where like elements are indicated with like numerals and elements not numbered in FIG. 8 have the same reference numerals as shown in FIG. 7. The embodiments of FIGS. 7 and 8 apply crest factor reduction (CFR) prior to the PD with an adaptation algorithm in one digital processor, so as to reduce the PAPR, EVM and ACPR and compensate the memory effects and variation of the linearity due to the temperature changing of the PA. The digital processor can take nearly any form; for convenience, an FPGA implementation is shown as an example, but a general purpose processor is also acceptable in many embodiments. The CFR implemented in the digital module of the embodiments is based on the scaled iterative pulse cancellation presented in patent application U.S. 61/041,164, filed Mar. 31, 2008, entitled An Efficient Peak Cancellation Method For Reducing The Peak-To-Average Power Ratio In Wideband Communication Systems, incorporated herein by reference. The CFR is included to enhance performance and hence optional. The CFR can be removed from the embodiments without affecting the overall functionality.

FIG. 7 is a block diagram showing a Digital Hybrid Mode Predistortion Power Amplifier (DHMPA) system implemented with DQM in accordance with an embodiment of the present invention. As illustrated in FIG. 7, DQM is implemented with an upconverter-based clipping error restoration path and an optional or alternative multi-channel digital input. The system shown in FIG. 7 has a dual mode of RF-in 700 and/or multi-carrier digital signal 705 at the input, and an RF signal at the output 710. The dual mode of signal input allows maximum flexibility: RF-in (the "RF-in Mode") or baseband digital-in (the "Baseband-in Mode"). The system shown in FIG. 7 comprises three key portions: a reconfigurable digital (hereinafter referred as "FPGA-based Digital") module 715, a power amplifier module 760 and a feedback path 725.

The FPGA-based Digital part comprises a digital processor 715 (e.g. FPGA), digital-to-analog converters 735 (DACs), analog-to-digital converters 740 (ADCs), and a phase-locked loop (PLL) 745. Since the embodiment of FIG.

7 has a dual input mode, the digital processor has two paths of signal processing. For the RF signal input path, the digital processor has implemented a digital quadrature demodulator (DQDM), a CFR, a PD, and a digital quadrature modulator (DQM). For the baseband digital input path, a digital up-converter (DUC), CFR, PD, and a DQM are implemented.

The RF-in Mode of the embodiment shown in FIG. 7 has implemented a down converter (DNC) 750 prior to the FPGA-based Digital part and an ADC 740 prior to the FPGA. An analog down converted signal is provided to the FPGA-based Digital module and converted to a digital signal by the ADC 740. The digitally converted signal is demodulated by the DQDM to generate both real and imaginary signals and then PAPR of the signal is reduced by CFR. The peak reduced signal is predistorted to linearize the amplifier and is passed through a DQM to generate the real signal and then converted to an intermediate frequency (IF) analog signal by a DAC in the FPGA-based Digital part. However, it is not required in all embodiments to implement DQDM and DQM in the FPGA. If, as shown in FIGS. 7 and 8, a digital modulator will not be used, then two DAC's 801 behind the FPGA feeding AQM module 800 can be used to generate real and imaginary signals, respectively (the "AQM Implementation").

The Baseband-in Mode of the system of FIG. 7 works slightly differently from the RF-in Mode. Digital data streams from multi-channels as I-Q signals are coming to the FPGA-based Digital module and are digitally up-converted to digital IF signals by the DUC. From this point onwards, the Baseband-in Mode and RF-in Mode proceeds identically. These IF signals are then passed through the CFR block so as to reduce the signal's PAPR. This PAPR suppressed signal is digitally predistorted in order to pre-compensate for nonlinear distortions of the power amplifier.

In either input mode, the memory effects due to self-heating, bias networks, and frequency dependencies of the active device are compensated by the adaptation algorithm in the PD, as well. The coefficients of the PD are adapted by a synchronizing the wideband captured output signal from the feedback path 725 with the reference signal. The digital predistortion algorithm performs the synchronization and compensation. The predistorted signal is passed through a DQM in order to generate the real signal and then converted to an IF analog signal by the DAC 740 as shown. As disclosed above, the DQM is not required to be implemented in the FPGA, or at all, in all embodiments. Alternatively, if the DQM is not used in the FPGA, then the AQM Implementation can be implemented with two DACs to generate real and imaginary signals, respectively. The gate bias voltage 753 of the power amplifier is determined by the adaptation algorithm and then adjusted through the DACs 535 in order to stabilize the linearity fluctuations due to the temperature changes in the power amplifier.

The power amplifier part comprises a UPC for a real signal (such as illustrated in the embodiment shown in FIG. 7), or an AQM for real and complex signals (such as the embodiment of a DHMPA system depicted in FIG. 8) from the FPGA-based Digital module, a high power amplifier with multi-stage drive amplifiers, and a temperature sensor. In order to improve the efficiency performance of the DHMPA system, efficiency boosting techniques such as Doherty, Envelope Elimination and Restoration (EER), Envelope Tracking (ET), Envelope Following (EF), and Linear amplification using Nonlinear Components (LINC) can be used, depending upon the embodiment. These power efficiency techniques can be mixed and matched and are optional features to the fundamental DHMPA system. One such Doherty power amplifier technique is presented in commonly assigned U.S. Provisional Patent Application Ser. No. 60/925,577, filed Apr. 23, 2007, entitled N-Way Doherty Distributed Power Amplifier, incorporated herein by reference, together with U.S. patent application Ser. No. 12/603,419, filed Oct. 21, 2009, entitled N-Way Doherty Distributed Power Amplifier with Power Tracking. To stabilize the linearity performance of the amplifier, the temperature of the amplifier is monitored by the temperature sensor and then the gate bias of the amplifier is controlled by the FPGA-based Digital part.

The feedback portion comprises a directional coupler, a mixer, a gain amplifier, a band pass filter (BPF), and a Digital to Analog Converter (DAC). Depending upon the embodiment, these analog components can be mixed and matched with other analog components. Part of the RF output signal of the amplifier is sampled by the directional coupler and then down converted to an IF analog signal by the local oscillation signal in the mixer. The IF analog signal is passing through the the gain amplifier, and the BPF (e.g., surface acoustic wave filter) which can capture the out-of-band distortions. The output of the BPF is provided to the ADC of the FPGA-based Digital module in order to determine the dynamic parameters of the digital PD depending on output power levels and asymmetrical distortions due to the memory effects. In addition, temperature is also detected by the detector 580 to calculate the variation of linearity and then adjust gate bias voltage of the PA. More details of the PD algorithm and self-adaptation feedback algorithm can be appreciated from FIG. 3, discussed above, which shows a polynomial-based predistortion algorithm and from FIG. 4, also discussed above, which shows the block diagram of the digital predistorter synchronization algorithm which can be used in some embodiments of the invention.

In the case of a strict EVM requirement for broadband wireless access such as WiMAX or other OFDM based schemes (EVM<2.5%), the CFR in the FPGA-based Digital part is only able to achieve a small reduction of the PAPR in order to meet the strict EVM specification. In general circumstances, this means the CFR's power efficiency enhancement capability is limited. In some embodiments of the present invention, a novel technique is included to compensate the in-band distortions from CFR by use of a "Clipping Error Restoration Path" 790, hence maximizing the DHMPA system power efficiency in those strict EVM environments. As noted above, the Clipping Error Restoration Path has an additional DAC 735 in the FPGA-based Digital portion and an extra UPC 720 in the power amplifier part (see FIGS. 7 and 8). The Clipping Error Restoration Path can allow compensation of in-band distortions resulting from the CFR at the output of the power amplifier. Further, any delay mismatch between the main path and the Clipping Error Restoration Path can be aligned using digital delay in the FPGA.

Referring again to FIG. 7, the RF input signal is first down-converted to baseband digital signals, and then digitally up-converted to digital IF signals (−7.5 MHz, −2.5 MHz, 2.5 MHz, 7.5 MHz). If the system of FIG. 7 has a Baseband-in Mode, then the digital data streams from multi-channels are digitally up-converted to digital IF signals (−7.5 MHz, −2.5 MHz, 2.5 MHz, 7.5 MHz) directly as they enter the digital processor. The CFR then reduces the PAPR. The peak-reduced signal is predistorted to linearize the DPA and is passing through two DACs for real and imaginary signals and finally through an AQM.

FIG. 9. is a block diagram showing an embodiment of the analog quadrature modulator compensation structure. The input signal is separated into an in-phase component $X_I$ and a quadrature component $X_Q$. The analog quadrature modulator compensation structure comprises four real filters {g11, g12, g21, g22} and two DC offset compensation parameters c1, c2. The DC offsets in the AQM will be compensated by the parameters c1, c2. The frequency dependence of the AQM will be compensated by the filters {g11, g12, g21, g22}. The order of the real filters is dependent on the level of compensation required. The output signals YI and YQ will be presented to the AQM's in-phase and quadrature ports.

The configuration of the power amplifier part and the feedback part of the system shown in FIG. 8 are the same as for the system shown in FIG. 7.

FIG. 8 illustrates an embodiment of a Digital Hybrid Mode Predistortion PA System implemented using a digital quadrature modulator with an upconversion-based clipping error restoration path and an optional or alternative multi-channel digital input with feedback calibration. In the system shown in FIG. 8, the DNC frequency translates the RF signal into a low IF signal. The IF signal is then presented to the ADC whereupon it is digitally down-converted to baseband followed by CFR and predistortion (PD). The output of the PD is a baseband signal which will then be digitally upconverted to an IF frequency and presented to the DAC. The output of the DAC is then further frequency translated to a RF frequency through the up-converter (UPC.) The configuration of the power amplifier part and the feedback part of system of FIG. 8 are the same as for the FIG. 7 System.

In summary, the DHMPA system of the present invention enhances efficiency and linearity relative to the prior art since the DHMPA system is able to implement CFR, DPD and adaptation algorithms in one digital processor, which consequently saves hardware resources and processing time. The DHMPA system is also reconfigurable and field-programmable since the algorithms and power-efficiency-enhancing features can be adjusted like software in the digital processor at anytime.

Furthermore, since the DHMPA system accepts RF modulated signal as input, it is not necessary to use coded I and Q channel signals in the baseband. Therefore, the performance of wireless base-station systems can be enhanced simply by replacing the existing PA modules with the DHMPA. The result is that the present invention provides a "plug and play" PA system solution such that the structure of existing base-station systems does not need to be modified or rebuilt for a new set of signal channels in order to benefit from high efficiency and high linearity PA system performance.

Moreover, the DHMPA system is agnostic to modulation schemes such as quadrature phase shift keying (QPSK), quadrature amplitude modulation (QAM), Orthogonal Frequency Division Multiplexing (OFDM), etc. in code division multiple access (CDMA), global system for wireless communications (GSM), WCDMA, CDMA2000, and wireless LAN systems. This means that the DHMPA system is capable of supporting multi-modulation schemes, multi-carriers and multi-channels. Other benefits of the DHMPA system of the present invention include correction of PA non-linearities in repeater or indoor coverage systems that do not have the necessary baseband signals information readily available.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:
1. A digital predistortion system for linearizing the output of power amplifiers comprising:
    an input configured to receive an input signal for wireless communications;
    at least one power amplifier for outputting an amplified signal;
    a feedback path including at least one feedback signal derived from the amplified signal, wherein the at least one feedback signal includes a representation of a noise characteristic of the power amplifier;
    digital predistortion logic for predistorting the input signal and supplying a predistorted signal to the at least one power amplifier, wherein the digital predistortion logic complies at least in part with the equation:

$$z(n) = \sum_{i=0}^{n-1} x_i(n-i) \left( \sum_{j=0}^{k-1} a_{ij} |x_i(n-i)|^j \right),$$

where $z(n)$ is a predistortion function, n is a variable representing time, $x_t$ is a transmission (input) signal, i, j, and k are counters for summation, N is a number of data per block, and $a_{ij}$ are predistortion coefficients;
    delay estimation logic configured to estimate the delay between the input signal and the feedback signal by maximizing an amplitude difference correlation of the input signal and the feedback signal, wherein the delay estimation logic selects between an integer delay when the amplitude difference correlation is odd and between a fractional delay when the amplitude difference correlation is even;
    a memory for storing the predistortion coefficients;
    estimator logic configured to determine the predistortion coefficients, wherein the estimator logic includes a least square algorithm, and wherein the predistortion coefficients are based at least in part on the estimated delay; and
    a multiplexor configured to receive the predistortion coefficients from the memory and configured to receive the predistortion coefficients from the estimator logic, wherein the multiplexor selects either the predistortion coefficients received from the memory or the predistortion coefficients received from the estimator logic, and wherein the multiplexor supplies the selected predistortion coefficients to the digital predistortion logic.

2. The digital predistortion system of claim 1 further comprising a digital module that includes one or more of a digital field programmable gate array, digital-to-analog converters, analog-to-digital converters, and a phase-locked loop.

3. The digital predistortion system of claim 1 wherein the power amplifier comprises at least one of an up-converter for real signals and an analog quadrature modulator for real and complex signals, a high power amplifier with multi-stage drive amplifiers, and a temperature sensor.

4. The digital predistortion system of claim 1, further comprising phase shift logic configured to compensate for a phase offset between the input signal and the feedback signal.

5. The digital predistortion system of claim 1, further comprising magnitude gain logic configured to compensate for a gain in the feedback signal.

6. The digital predistortion system of claim 1, wherein the predistortion coefficients stored in the memory are determined by a QR-RLS algorithm.

7. The digital predistortion system of claim 1, wherein the delay estimation logic includes a delay selection multiplexor configured to select between the integer delay and the fractional delay.

8. The digital predistortion system of claim 1, wherein the fractional delay is a half-sample delay.

9. The digital predistortion system of claim 1, wherein the predistortion coefficients are based at least in part on the estimated delay and at least in part on a weighting factor.

10. The digital predistortion system of claim 1, wherein the digital predistortion logic comprises a plurality of finite impulse response (FIR) filters.

* * * * *